United States Patent
Schiebel et al.

(10) Patent No.: US 10,974,958 B2
(45) Date of Patent: Apr. 13, 2021

(54) MICROMECHANICAL COMPONENT AND METHOD FOR PRODUCING SAME

(71) Applicant: Fraunhofer-Gesellschaft zur Förderung der angewandten Forschung e.V., Munich (DE)

(72) Inventors: Felix Schiebel, Ludwigsburg (DE); Christoph Eberl, Endingen (DE); Matthew Berwind, Freiburg (DE); Peter Gumbsch, Gundelfingen (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 241 days.

(21) Appl. No.: 15/500,430

(22) PCT Filed: Jul. 14, 2015

(86) PCT No.: PCT/EP2015/066064
§ 371 (c)(1),
(2) Date: Jan. 30, 2017

(87) PCT Pub. No.: WO2016/015996
PCT Pub. Date: Feb. 4, 2016

(65) Prior Publication Data
US 2017/0210621 A1  Jul. 27, 2017

(30) Foreign Application Priority Data

Jul. 31, 2014  (DE) .................... 10 2014 215 061.2

(51) Int. Cl.
*B81C 1/00* (2006.01)
*B81C 99/00* (2010.01)
(Continued)

(52) U.S. Cl.
CPC ........ *B81C 1/00373* (2013.01); *B29C 64/135* (2017.08); *B33Y 10/00* (2014.12);
(Continued)

(58) Field of Classification Search
CPC .... G03F 7/2051; G03F 7/2053; G03F 7/0037; G03F 7/70416
See application file for complete search history.

(56) References Cited

U.S. PATENT DOCUMENTS 4,575,330 A * 3/1986 Hull ...................... G03F 7/0037
156/58
4,752,498 A * 6/1988 Fudim .................... B01J 19/121
118/620
(Continued)

FOREIGN PATENT DOCUMENTS

DE  10 2009 000 642 A1   9/2010
DE  10 2011 105 679 A1  12/2012
(Continued)

OTHER PUBLICATIONS

Machine translation for Takeuchi (JP 60179240A).*
(Continued)

*Primary Examiner* — Erik T. K. Peterson
(74) *Attorney, Agent, or Firm* — Brinks Gilson & Lione

(57) ABSTRACT

A method for producing micromechanical components is provided. A liquid starting material which can be cured by means of irradiation is applied onto a substrate. A partial volume of the starting material is cured by means of a local irradiation process using a first radiation source in order to produce at least one three-dimensional structure. The three-dimensional structure delimits at least one closed cavity in which at least one part of the liquid starting material is enclosed. Alternatively or in addition, a micromechanical component is provided that contains a liquid starting mate-
(Continued)

rial, which is partly cured by means of irradiation, and at least one cavity in which the liquid starting material is enclosed.

9 Claims, 5 Drawing Sheets

(51) Int. Cl.
  *B33Y 80/00* (2015.01)
  *B81C 3/00* (2006.01)
  *B33Y 10/00* (2015.01)
  *B29C 64/135* (2017.01)
  *B81B 7/00* (2006.01)

(52) U.S. Cl.
  CPC ............ *B33Y 80/00* (2014.12); *B81B 7/0074* (2013.01); *B81C 3/001* (2013.01); *B81C 99/0095* (2013.01); *B81B 2201/038* (2013.01); *B81B 2201/047* (2013.01); *B81B 2203/0315* (2013.01); *B81B 2203/0392* (2013.01); *B81C 2201/0188* (2013.01); *B81C 2203/038* (2013.01)

(56) References Cited

U.S. PATENT DOCUMENTS

| | | | | |
|---|---|---|---|---|
| 4,999,143 | A * | 3/1991 | Hull | B29C 41/12 156/273.3 |
| 5,031,120 | A | 7/1991 | Pomerantz et al. | |
| 5,120,476 | A * | 6/1992 | Scholz | B29C 67/0066 156/273.5 |
| 5,137,662 | A * | 8/1992 | Hull | G01J 1/4257 118/620 |
| 5,171,490 | A * | 12/1992 | Fudim | G03F 7/0037 264/308 |
| 5,204,823 | A * | 4/1993 | Schlotterbeck | B29C 64/135 264/401 |
| 5,219,712 | A * | 6/1993 | Evans | B29C 35/08 257/E21.502 |
| 5,273,691 | A * | 12/1993 | Hull | B44B 1/006 118/423 |
| 5,534,101 | A * | 7/1996 | Keyworth | B29C 41/22 156/244.12 |
| 5,595,703 | A * | 1/1997 | Swaelens | A61B 17/58 156/272.8 |
| 5,945,058 | A * | 8/1999 | Manners | B29C 41/12 264/308 |
| 6,273,478 | B1 | 8/2001 | Benett et al. | |
| 8,219,712 | B2 | 7/2012 | Riddoch et al. | |
| 2001/0025203 | A1 * | 9/2001 | Gervasi | G06T 19/00 700/98 |
| 2002/0185782 | A1 * | 12/2002 | Koch | B33Y 40/00 264/401 |
| 2003/0203158 | A1 * | 10/2003 | Farnworth | B29C 41/20 428/137 |
| 2005/0208431 | A1 * | 9/2005 | Devoe | G02B 6/1221 430/321 |
| 2007/0105972 | A1 * | 5/2007 | Doyle | B81C 99/0095 522/1 |
| 2009/0051935 | A1 * | 2/2009 | Cooper | B23K 33/00 356/616 |
| 2010/0210156 | A1 | 8/2010 | Gallato | |
| 2012/0135235 | A1 * | 5/2012 | Bong | C08J 3/075 428/402 |
| 2012/0325775 | A1 | 12/2012 | Thiel et al. | |
| 2015/0306794 | A1 * | 10/2015 | Kang | G03F 7/0035 164/520 |
| 2015/0309473 | A1 * | 10/2015 | Spadaccini | G03H 1/2294 359/3 |

FOREIGN PATENT DOCUMENTS

| | | |
|---|---|---|
| JP | S60-179 240 A | 9/1985 |
| WO | WO 2006/018044 A1 | 2/2006 |

OTHER PUBLICATIONS

Karlsruhe Institute of Technology (KIT), "LIGA Process—Institute of Microstructure Technology (IMT)" dated Jul. 2, 2010, pp. 1-4, KIT—The Research University in the Helmholtz Association, available at http://www.imt.kit.edu/liga.php.

IBM Research—Zurich News, "15 Moore's Years—3D chip stacking will take Moore's Law past 2020," dated Jul. 21, 2014, pp. 1-2, IBM, available at http://www.zurich.ibm.com/news/10/moore.html.

Chiou, J.-C. et al. "CMOS-MEMS prestress vertical cantilever resonator with electrostatic driving and piezoresistive sensing" dated Sep. 25, 2008 pp. 1-8, J. Phys. D: Appl. Phys. 41 (2008) 205102, available at: www.stacks.iop.org/JPhysD/41/205102. © IOP Publishing Ltd.

Zhang, L. et al. Residual stresses in Pt bottom electrodes for sol-gel derived lead zirconate titanate thin films, dated 2003, pp. 1-4, Journal of the European Ceramic Society 24 (2004) 1673-1676, available at www.elsevier.com/locate/jeurceramsoc © 2003 Elsevier Ltd.

Gray, B.L. et al. "Novel interconnection technologies for integrated microfluidic systems" dated 1999, pp. 1-9, Sensors and Actuators 77 (1999) 57-65, available at www.elsevier.nl/locate/sna © 1999 Elsevier Science S.A.

* cited by examiner

MICROMECHANICAL COMPONENT AND METHOD FOR PRODUCING SAME

CROSS-REFERENCE TO RELATED APPLICATIONS

This application is a 371 nationalization of PCT/EP2015/066064, entitled "MICROMECHANICAL COMPONENT AND METHOD FOR PRODUCING SAME," having an international filing date of Jul. 14, 2015, the entire contents of which are hereby incorporated by reference, which in turn claims priority under 35 USC § 119 to German patent application 10 2014 215 061.2 filed on Jul. 31, 2014, the entire contents of which are hereby incorporated by reference.

BACKGROUND

U.S. 2012/0325775 A1 discloses a method for producing three-dimensional microstructures. In this known method, a liquid material is cured by means of exposure using a focused laser beam. Having concluded the exposure, the remaining liquid material can be removed and the desired micromechanical component remains on the substrate.

However, the drawback of this known method is that merely static structures can be produced. A subsequent adaptation or post-processing of the components and the production of movable components are excluded.

DETAILED DESCRIPTION

Figure 1:
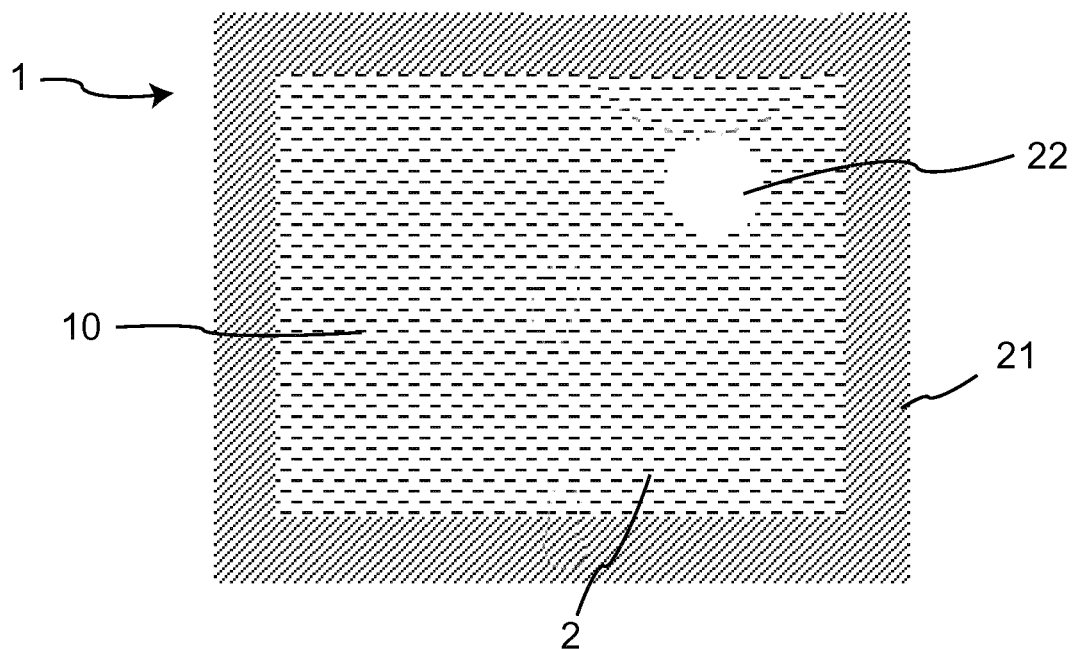
FIG. 1 shows a cross-section through a micromechanical component in a first embodiment.

Proceeding from this prior art, the object of the invention is to provide micromechanical components and a method for producing same, in which the micromechanical components can be easily post-processed and/or which can provide micromechanical components with movable individual parts.

The invention relates to a method for producing micromechanical components, wherein a liquid starting material which can be cured by means of irradiation is applied onto a substrate, a partial volume of the starting material is cured by means of a local irradiation process using a first radiation source in order to produce at least one three-dimensional structure and the remaining liquid starting material is at least partly removed. The application also relates to a micromechanical component which contains a liquid starting material, part of which was cured by irradiation.

It is proposed according to the invention to use a liquid starting material for producing micromechanical components, said starting material being curable by means of irradiation. In some embodiments of the invention, the starting material can be a generally known photoresist which polymerizes upon irradiation. The photoresist can contain a polymer, e.g. polymethyl methacrylate and/or polymethylglutarimide. In other embodiments of the invention, the starting material can contain at least one epoxy resin. In addition, the starting material can contain solvents, e.g. cyclopentanone or γ-butyrolactone.

For easier handling, the starting material can be applied onto a substrate, at least during the production of the micromechanical component. In some embodiments of the invention, the substrate can be a glass or a semiconductor, e.g. a silicon wafer. In other embodiments of the invention, the substrate can contain or consist of sapphire. Having produced the micromechanical component, it can remain on the substrate, e.g. to monolithically integrate the micromechanical component together with microoptical and/or microelectronic components. In other embodiments of the invention, the micromechanical component can be removed from the substrate after the production thereof and can be further processed separately.

In order to cure the starting material, some embodiments of the invention can use electromagnetic radiation. Due to its high brilliance, laser radiation from a first light source can advantageously be used for curing the starting material. In other embodiments of the invention, the starting material can be cured by a particle beam, e.g. an electron beam or a heavy-ion beam.

In some embodiments of the invention, laser radiation can have a wavelength of about 2 μm to about 0.2 μm. In other embodiments of the invention, the laser radiation can have a wavelength of about 2 μm to about 1 μm. In this case, the curing can be stimulated by multiphoton processes, as a result of which the respectively cured space region can be limited to the focal point with maximum intensity. In this way, it is also possible to influence, by changing the focal position, the depth, in which the starting material cures. Together with a translational movement of the light beam, a three-dimensional structure can in this way be written into the starting material.

Since the liquid starting material was cured by point-to-point writing in predeterminable space regions, at least part of the remaining liquid starting material can be removed.

According to the invention, it is now proposed that the three-dimensional structure delimits at least one cavity in which the liquid starting material is enclosed. According to the invention, it was recognized that the liquid starting material can be used within the cavity as a hydraulic fluid in order to produce micromechanical hydraulic components. In this way, the micromechanical component can be or contain e.g. a hydraulic actuator and/or sensor.

In other embodiments of the invention, a micromechanical component which encloses a comparatively thin-walled cavity can subsequently be deformed in such a way that a mechanical tension is formed in the wall. In again another embodiment of the invention, a micromechanical component which encloses a comparatively thin-walled cavity can subsequently be deformed in such a way at least part of the wall adapts itself to the shape of an adjacent micro- or macromechanical component. If a permanent movability is not desired or not required, the liquid starting material can subsequently be cured or polymerized in the interior of the cavity, as a result of which the micromechanical component contains liquid starting material in the cavity only during the production thereof.

In some embodiments of the invention, the cavity can contain at least one reinforcing element. The reinforcing element can be provided to prevent or delimit a deformation of the micromechanical component or a deformation of at least a partial area of a boundary wall of the cavity. This serves to produce mechanically more stable structures. In some embodiments of the invention, the reinforcing element can also be written into the liquid starting material by point-to-point exposure using a focused light beam from a first light source.

In some embodiments of the invention, the liquid starting material can be converted into the gas phase in a subsequent method step. As a result, the cavity can be filled with liquid starting material and additionally or alternatively also with a gas. Due to this, the cavity can have a greater elasticity and/or modified damping in some embodiments of the invention. In other embodiments of the invention, the gas can be used as a hydraulic fluid in order to drive a micromechanical actuator and/or to realize a micromechanical sensor. In some embodiments of the invention, the conversion into the gas phase can be done by laser radiation which dissociates the molecules of the originally liquid starting material and thus decomposes the starting material.

In some embodiments of the invention, the cavity can be delimited by a thin membrane which is opened and/or pierced through in a subsequent method step. As a result, at least part of the starting material can leave the cavity. In some embodiments of the invention, the liquid starting material can be cured in a subsequent method step by irradiation using a second radiation source. The second radiation source can be selected from a superluminescence diode, a defocused laser beam, an arc lamp, a gas discharge lamp, natural sunlight or further radiation sources not mentioned herein. The second radiation source can produce a comparatively wide light beam and/or emit a smaller wavelength than the first radiation source. Due to this, the entire volume of a cavity or a micromechanical component can be irradiated at the same time so as to rapidly cure the entire content of liquid starting material in one or more cavities. Due to this, comparatively large micromechanical components can be produced in a faster and/or easier way since only comparatively thin boundary walls of the cavities and optionally individual reinforcing elements have to be produced by point-to-point exposure using laser radiation. Having removed the liquid starting material outside the cavities, the micromechanical component can be rapidly cured completely by large-area irradiation using the second light source so as to receive its final stability without having to write comparatively thick-walled structures into the liquid starting material by a strongly focused laser beam in an elaborate way. Following the adaptation to a desired final shape it is likewise possible to rapidly fix geometrically complex micromechanical components in this final shape by large-area irradiation with the second light source.

In some embodiments of the invention, at least two micromechanical components can be joined in positive connection. For this purpose, a thin-walled delimited cavity can be used that abuts on the component to be joined before this form is fixed by curing the liquid starting material within the cavity.

In some embodiments of the invention, structures having different dimensions can be connected to one another. If they are coupled hydraulically and/or mechanically, microscopic actuators can be operated with macroscopic tools, such as tweezers or a rod.

The invention shall be explained in more detail below by means of drawings without confining the general inventive concept.

FIG. 1 shows the cross-section through a micromechanical component 1. The micromechanical component 1 contains substantially a cuboid cavity 10. The cuboid cavity can be regarded as an embodiment for the basic shape of the present invention. In other embodiments, the micromechanical components can have more complex geometries, such that they can comply with the intended purpose. For example, the cavity can have other polygonal, round or elliptic cross-sections.

The micromechanical component is produced from liquid starting material 2 which can be cured by irradiation. Electromagnetic radiation can preferably be used which focusses on a focal point and is produced by a first radiation source. The beam can be movable in the plane of the substrate receiving the starting material, e.g. by means of an x-y table or by at least one deflection mirror. In this way, a three-dimensional structure can be written into the starting material by selecting the irradiation point in the plane and by selecting the focal position by point-to-point exposure.

In some embodiments of the invention, the starting material 2 polymerizes by short-wave visible or U.V. radiation such that it can be cured by the irradiation and polymerized solid starting material 21 is formed. In some embodiments of the invention, a first radiation source is used for infrared or long-wave visible light in order to solidify the starting material 2 in predeterminable space regions by point-to-point exposure. In these cases, the polymerization is triggered by multiphoton processes such that the starting material is preferably solidified on the focal point with maximum intensity and the remaining beam path largely remains largely unaffected by the light of the first radiation source. The solidified material 21 encloses the cavity 10, the interior of which continues to contain liquid starting material 2. If the cavity is enclosed on all sides, the liquid starting material 2 is enclosed within the cavity.

Depending on the intended use of the micromechanical component, the liquid starting material 2 in the cavity 10 can be cured at a later date. This can be done very rapidly and efficiently by a second light source which irradiates a large area of the micromechanical component 1 and emits radiation with shorter waves, e.g. ultraviolet or short-wave visible radiation. In other embodiments of the invention, the starting material 2 can remain in a liquid form within the cavity 10, e.g. to enable an elasticity of the micromechanical component in order to control a vibration damping of the self-resonance of the material or to effect a hydraulic form and/or volume change of the cavity 10. In another embodiment of the invention, the liquid starting material 2 can be dissociated by laser radiation and thus be converted into a gaseous aggregate state. As a result, gas inclusions 22 can be formed in the interior of the cavity 10. In some of the embodiments of the invention, the entire volume of the liquid starting material 2, which is enclosed after the production of the cavity therein, can be dissociated, as a result of which the cavity 10 is filled exclusively with a gas. Prior to the dissociation, the volume of the liquid can be smaller than the volume of the cavity. Due to the gas filling, the pressure and thus the form of the cavity can change or the damping behavior can be influenced or the resistance to outer deformation can be influenced.

Figure 2:
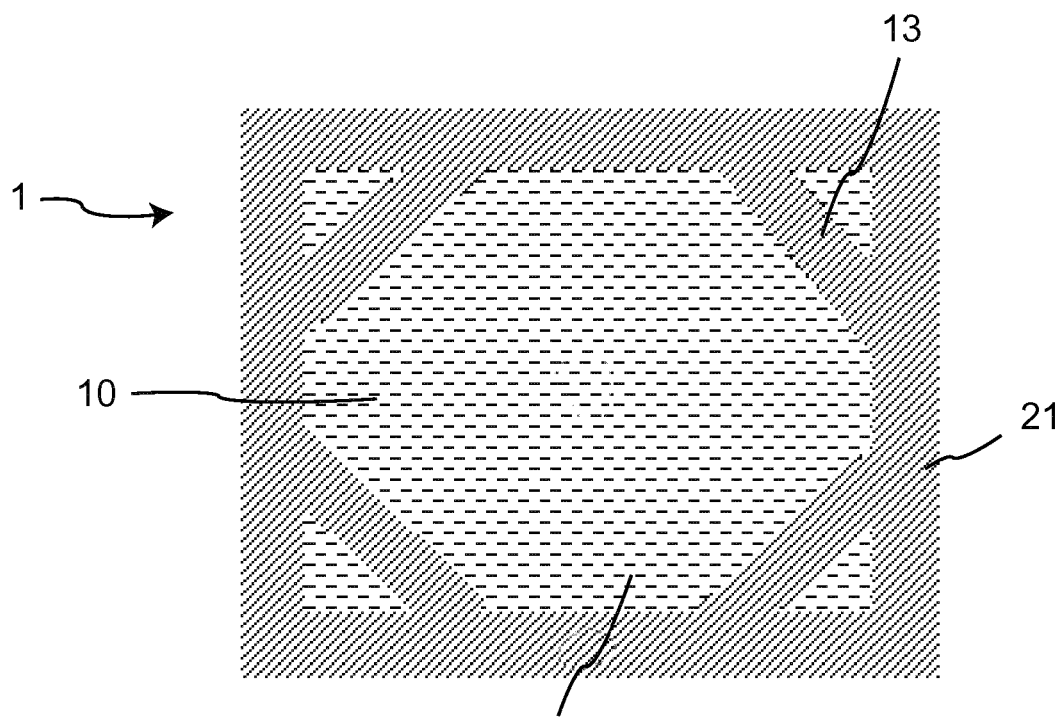
FIG. 2 shows the cross-section through a micromechanical component in a second embodiment.

FIG. 2 shows a further embodiment of the invention. In this case, too, the micromechanical component 1 is an approximately cuboid cavity 10, which only explains the function of the present invention by way of example.

The embodiment according to FIG. 2 differs from the above described embodiment by reinforcing elements 13, which can increase the mechanical load capacity of the areas of cured material 21 that form the wall of the cavity 10. In some embodiments of the invention, the cavity 10 can only be filled with liquid starting material 2 at times during the production of the micromechanical component. For example, if a large mechanical stability of the micromechanical component is required, this is accompanied by great wall thicknesses of the structures forming the micromechanical component. The point-to-point exposure of such structures requires correspondingly long process times. Therefore, an embodiment according to the invention proposes to only produce the outer edging and optionally reinforcing elements 13 by focused laser radiation in the liquid starting material and to then cure the entire volume of the cavity 10 by large-area irradiation. An undesired deformation of the mechanical component during the production and before the complete curing can here be prevented by reinforcing elements 13 which in some embodiments of the invention run through the cavity 10 like a framework.

Figure 3:
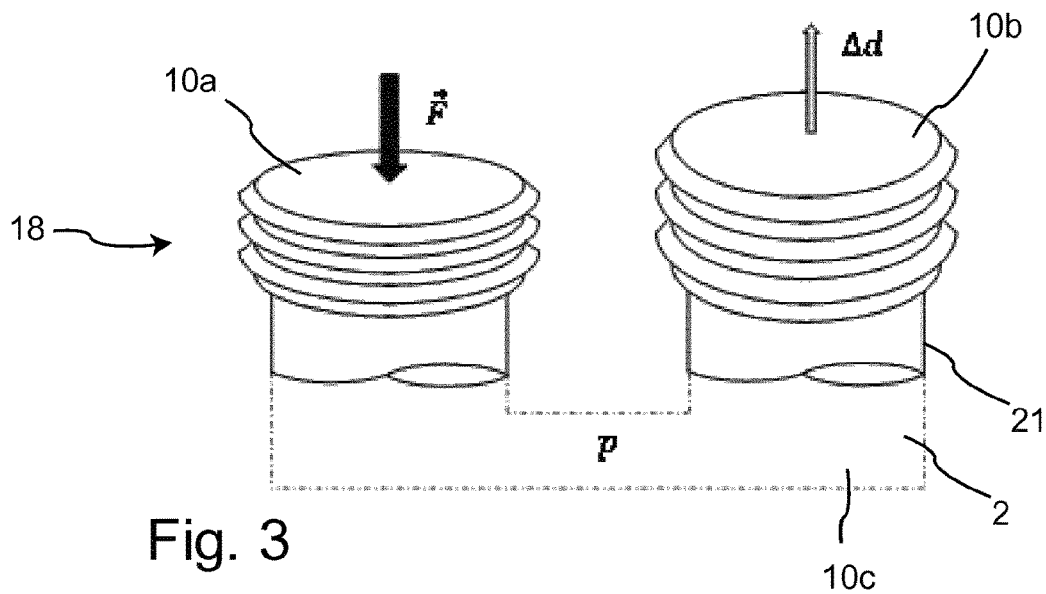
FIG. 3 shows a hydraulic actuator as a possible application example of the invention.

FIG. 3 shows a hydraulic actuation element 18 as an embodiment for a micromechanical component according to the present invention. The hydraulic actuation element 18 contains a first cavity 10a, a second cavity 10b and a third cavity 10c connecting the two cavities. The three cavities 10a, 10b and 10c are delimited by cured material 21. The wall thickness of the cured material 21 can be selected differently in different partial areas such that the boundary walls of the cavities are either largely dimensionally stable or deformable. In this way, the cavities 10a and 10b are enclosed by elastically deformable boundary walls which can be deformed in the manner of a bellows. The cavity 10c is largely dimensionally stable and does not change its volume or only changes it slightly. If a force F is exerted on the upper boundary surface 10a, this increases the pressure in the interior of the cavity 10a and 10c in such a way that the cavity 10b is increased. On account of the geometry selected for the boundary walls, this volume increase is due to a movement of the upper boundary surface of the cavity 10b by the amount Δd, said movement being opposed to the action of the force F. If a corresponding force is exerted on the upper boundary surface of the cavity 10b, the upper boundary surface of the cavity 10a moves correspondingly. The micromechanical component shown in FIG. 3 is thus a hydraulic actuation element which uses the liquid starting material 2 enclosed in the cavities 10a, 10b and 10c as a hydraulic fluid.

In some embodiments of the invention, the micromechanical component shown in FIG. 3 can have in each case a height of about 0.03 mm to about 3 mm or of about 0.1 mm to about 1.0 mm. In some embodiments of the invention, the micromechanical component shown in FIG. 3 can have a width of about 0.02 mm to about 10 mm or of about 0.05 mm up to about 1.0 mm. Small details or structures can have a structural size of less than 0.8 μm or less than 0.2 μm.

Figure 4:
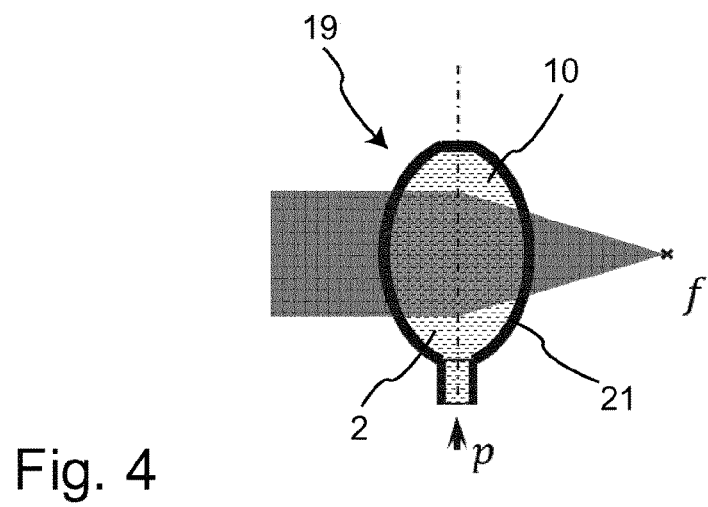
FIG. 4 and FIG. 5 show a microlens having a variable refractive power.
Figure 5:
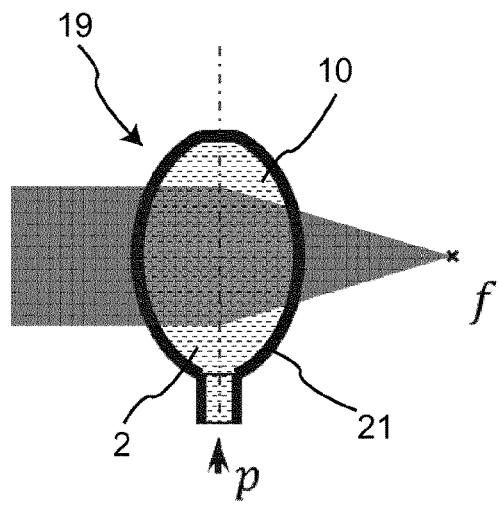

FIGS. 4 and 5 explain the functioning of a lens 19 as an embodiment of a micromechanical component 1. The lens 19 again contains a cavity 10 which is delimited by cured starting material 21. The cavity 10 is filled with liquid starting material 2. The boundary wall of the cavity 10 has a curvature so as to focus electromagnetic radiation penetrating the lens on a focal point f.

As shown in FIG. 5, another deformation of the boundary surfaces of the lens 19 can be achieved by raising the pressure of the liquid starting material 2 in the cavity 10 in such away that the curvature of the boundary surfaces is increased and the refractive power of the lens 19 is raised. This changes the position of the focal point f. The lens 19 according to the invention can be used as a microlens that can be focused, as a result of which the refractive index of the lens can be adapted during the operation. In other embodiments of the invention, the refractive power can be adjusted once by adapting the internal pressure to a desired value and can be fixed in the interior of the cavity 10 in this position by subsequently exposing and curing of the liquid starting material 2.

In some embodiments of the invention, the micromechanical lens shown in FIGS. 4 and 5 can have a diameter of about 0.1 mm to about 1 mm or of about 0.3 mm to about 0.8 mm. The lens can be integrated with further optical or electronic components on a substrate to give a microoptical chip.

Figure 6:
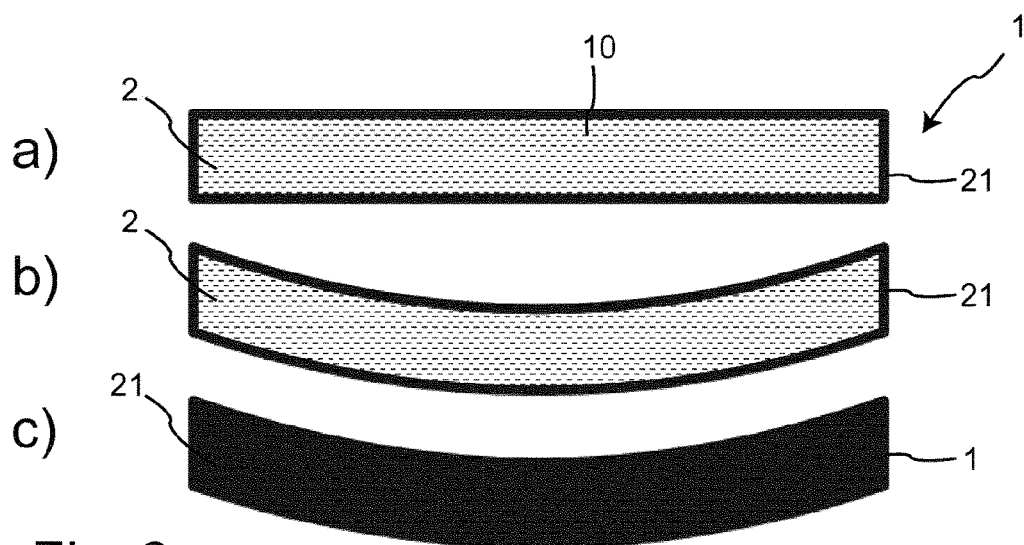
FIG. 6 explains the subsequent dimensional change of a micromechanical component.

FIG. 6 shows the subsequent adaptation of the form of a micromechanical component.

As an exemplary embodiment FIG. 6a shows again a micromechanical component in the form of a rectangular cuboid which has a cavity 10. The cavity 10 is delimited by cured starting material 21 and filled with liquid starting material 2. Having produced the micromechanical component 1 by point-to-point exposure of the boundary wall and removal of the remaining liquid starting material 2 in the outer region around the micromechanical component, the form can be adapted to a desired target form.

FIG. 6b shows by way of example the curved part of the initially rectangular cross-section, which leads e.g. to the form of a cylindrical lens. In other embodiments of the invention, the dimensional change can also serve to establish a positive engagement with respect to an adjacent component or induce a mechanical tension in a boundary surface of the mechanical component or influence the relative positions of two components.

FIG. 6c shows the micromechanical component 1 after curing the entire content of the cavity 10 by large-area exposure using a radiation source. Since the deformability of the micromechanical component is based in the second method step substantially on the fact that the boundary walls of the cavity are only thin-walled and thus have little mechanical stability and the liquid starting material 2 in the cavity 10 cannot transmit any shear forces, the micromechanical component 1 can be fixed in this form after carrying out the third method step, as a result of which a subsequent undesired deformation is avoided.

Figure 7:
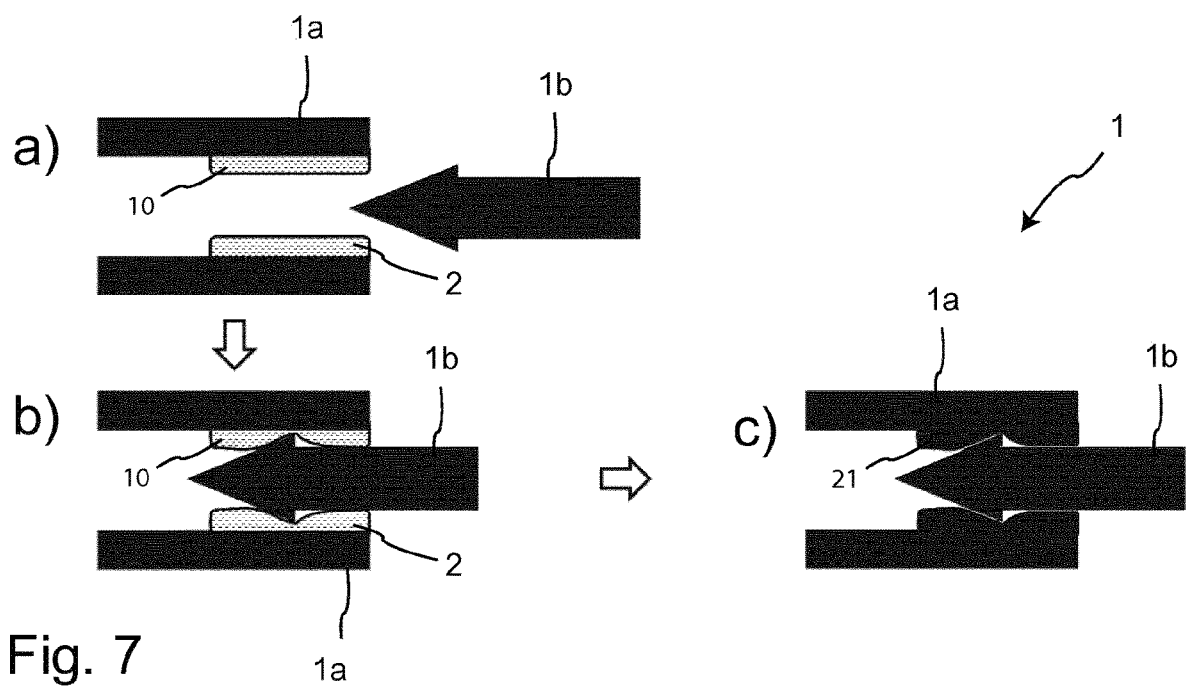
FIG. 7 explains the connection of two micromechanical components in a first embodiment.

FIG. 7 explains the production of a positive connection between two micromechanical components 1a and 1b. The micromechanical component 1a has a through-hole or a blind hole, on the inner side of which a cavity 10 is formed which encloses liquid starting material 2. The wall of the cavity 10 is thin-walled, as a result of which the wall is deformable.

The second component 1b is shown in arrow-shaped fashion in the embodiment. In other embodiments of the invention, it is, of course, possible to choose another form. What is essential is merely that a partial area can be introduced into the recess of the component 1a where it has a widening that results in a deformation of the boundary wall of the cavity 10. This state is shown in FIG. 7b. It can be seen that the boundary wall of the cavity 10 abuts on the shaft of the component 1b, the protruding parts acting like barbs. In the position shown in FIG. 7b, a simple correction of the relative position of the components 1a and 1b is still possible since the liquid starting material 2 in the cavity 10 cannot transmit any shear forces and therefore the component 1b can adopt a different position within the component 1a when the relative position is changed.

Having found the end position or the final relative position of the two components 1a and 1b, a fixed, positive and thus low-tension connection can be established between the components 1a and 1b by optional exposure of the liquid starting material 2.

Figure 8:
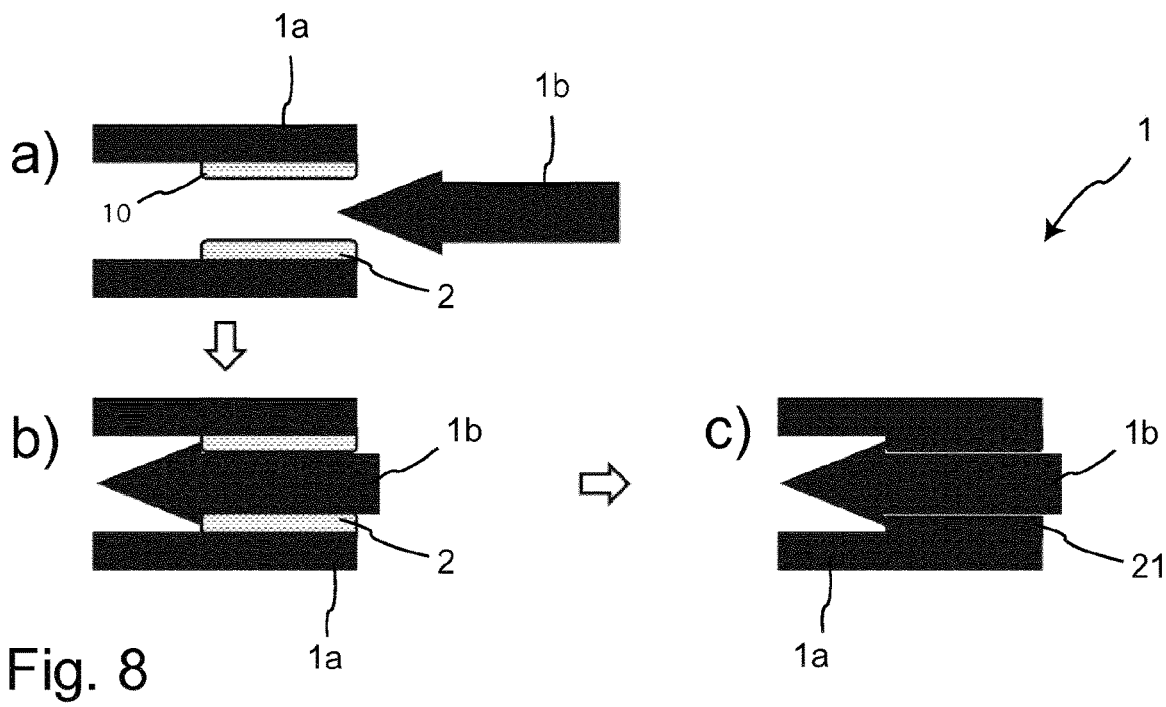
FIG. 8 explains the connection of two micromechanical components in a second embodiment.

FIG. 8 shows a second embodiment of a positive connection between two micromechanical components 1a and 1b. Equal components of the invention are provided with equal reference signs, and therefore the below description is limited to the essential differences. As shown in FIG. 8b, the component 1b is inserted into the recess of the component 1a to such an extent that the boundary surfaces of the cavity 10 abut all-over against the shaft of the component 1. In this way, the cavity 10 adopts again its original form after introducing the component 1b.

Having optionally cured the liquid starting material 2 by exposing the cavity 10, the fully tension-free attachment of the component 1b in the component 1a is obtained, said attachment being shown in FIG. 8c. In addition, an axial slidability of component 1b might be maintained, however, without it being possible to separate the component 1b from the component 1a.

Figure 9:
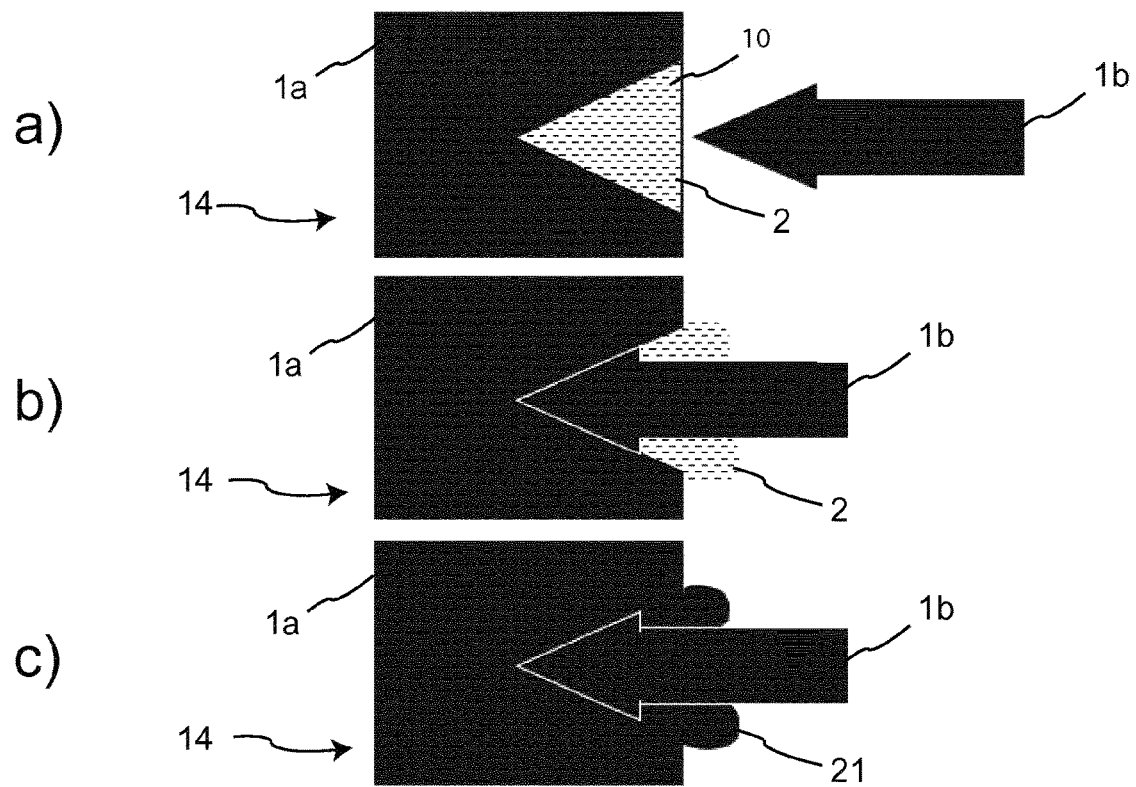
FIG. 9 explains the connection of two micromechanical components in a third embodiment.

FIG. 9 shows a third embodiment of a connecting element according to the present invention. In this case, too, a component 1a and a component 1b shall be permanently connected to one another. As shown in FIG. 9a, a cavity is made in the component 1a, the form of which is complementary to a partial area of the component 1b in some embodiments of the invention. The cavity 10 is closed by a thin membrane made of solidified starting material to prevent liquid starting material 2 from leaving the cavity.

FIG. 9b shows how the membrane is penetrated when the component 1b is inserted into the cavity and at least part of the liquid starting material is thus driven out of the cavity 10. The liquid starting material 10 adheres in the cavity 10 and on the component 1b in the region of the joint. When the liquid starting material 2 is exposed, it solidifies, as a result of which the solidified starting material 21 effects a safe and tension-free connection of the two components 1a and 1b.

Figure 10:
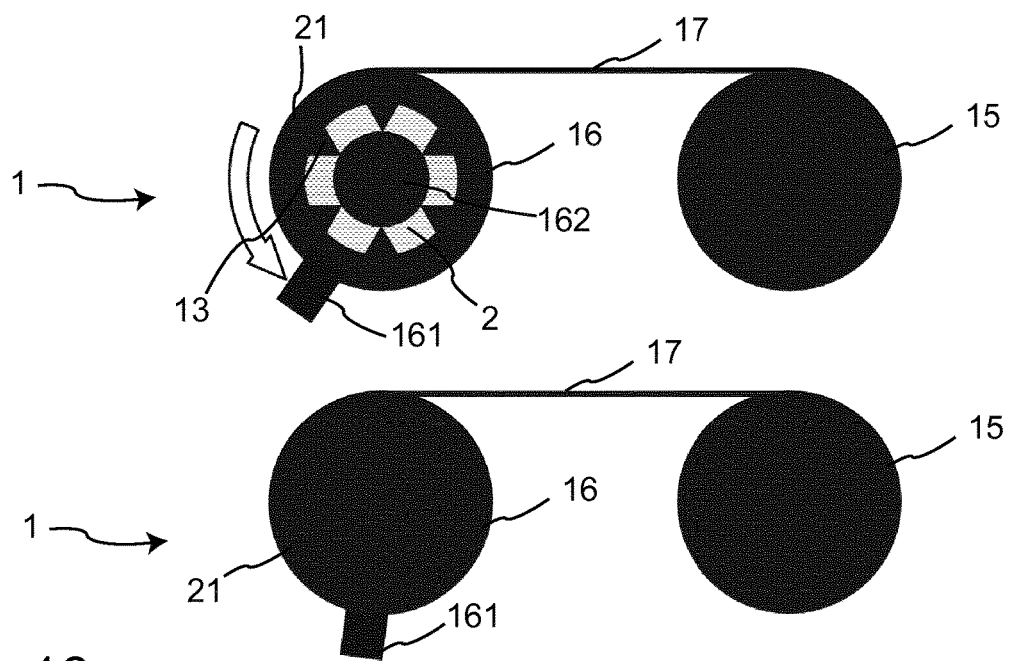
FIG. 10 illustrates the production of a mechanical preloading in a micromechanical component.

FIG. 10 shows by way of example how to permanently implant a mechanical tension into a micromechanical component 1 during the manufacturing method. A string or a film 17 is shown by way of example and is pre-tensioned by two tension elements 15 and 16.

The first tension element 15 consists substantially of permanently cured starting material 21 which is produced from liquid starting material by local exposure with a radiation source.

In the same way, the string or the planar element 17 is produced by exposure with a radiation source that can be focused in the liquid starting material.

The second tension element 16 has a stationary axis 162. The outer part of the tension element 16 is in point contact with the axis 162 via reinforcing elements 13, as a result of which cavities are formed between the outer part of the tension element and the axis 162, said cavities being filled with liquid starting material 2, wherein the outer part of the tension element can be rotated about the axis 162.

Furthermore, the outer tension element 16 has a lever 161. The outer tension element 16 can be rotated about the axis 162 by implanting a force on the lever 161, as a result of which the point contacts of the reinforcing elements 13 are discontinued at the axis 162 and a mechanical tension is implanted onto the element 17. Having reached the desired value, the material 2 in the cavities can be cured by exposure so as to fix the tension element 16 in this position. As a result, the mechanical force is permanently implanted in the element 17.

Figure 11:
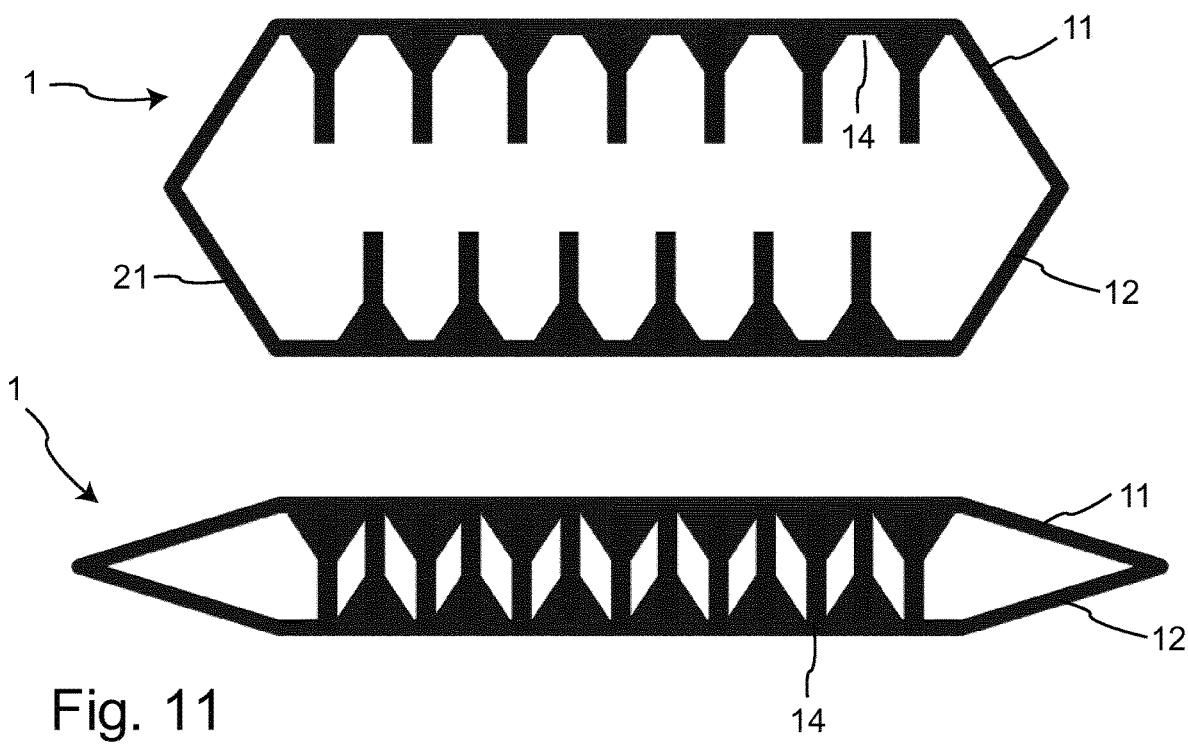
FIG. 11 explains the production of a micromechanical component from several partial components.

FIG. 11 shows a mechanical component 1 which is composed of a first partial structure 11 and a second partial structure 12. As a result, it is thus possible that, upon completion, the structural size of the mechanical component 1 is smaller than usually rendered possible by the manufacturing method since the structuring of one partial component engages the intermediate spaces of the structurings of the other partial components. The mechanical component 1 according to FIG. 11 can be used e.g. as a filter for surface waves or microwaves.

In order to permanently connect the two partial structures 11 and 12, it is possible to use e.g. the connecting elements 14 shown in FIG. 9.

Of course, the invention is not limited to the embodiments shown in the drawings. Therefore, the above description should not be considered limiting but explanatory. The below claims should be comprehended in such a way that a feature mentioned is present in at least one embodiment of the invention. This does not rule out the presence of further features. In so far as the claims and the above description define "first" and "second" features, this designation serves to distinguish two similar features without determining an order.

The invention claimed is:

1. A method for producing a micromechanical component comprising at least one three-dimensional structure, the method comprising:
    applying a liquid starting material, which can be cured by irradiation, onto a substrate,
    curing the starting material by local irradiation using radiation from a first radiation source in a partial volume in order to produce the at least one three-dimensional structure, wherein said first radiation source comprises focusing means being adapted to focus said radiation on a focus position and selecting said partial volume by moving the focus position in three dimensions inside the starting material,
    wherein the at least one three-dimensional structure comprises at least one closed cavity, which encloses at least part of the liquid starting material.

2. The method of claim 1, wherein the at least one closed cavity contains at least one reinforcing element.

3. The method of claim 1, wherein at least a part of the liquid starting material enclosed in the at least one closed cavity is converted into a gas phase.

4. The method of claim 1, wherein the liquid starting material enclosed in the at least one closed cavity is cured in a subsequent method step by irradiation using a second radiation source.

5. The method of claim 1, wherein the liquid starting material enclosed in the at least one closed cavity is pressurized in order to deform the at least one closed cavity.

6. The method of claim 3, wherein a mechanical tension is produced in the cured starting material of the micromechanical component by converting at least a part of the liquid starting material enclosed in the at least one closed cavity into the gas phase.

7. The method of claim 4, wherein the micromechanical component is a first micromechanical component, and wherein the first micromechanical component and at least a second micromechanical component are joined by a formfitting engagement and curing at least a part of the liquid starting material enclosed in the at least one closed cavity.

8. The method of claim 1 wherein the micromechanical component is a first micromechanical component, and wherein the first micromechanical component and at least a second micromechanical component are joined, thereby displacing at least a part of the liquid portion of the starting material enclosed in the at least one closed cavity.

9. The method of claim 5, wherein a mechanical tension is produced in the cured starting material of the micromechanical component by pressurizing at least one closed cavity.

\* \* \* \* \*